United States Patent
Xie et al.

(10) Patent No.: US 7,754,008 B2
(45) Date of Patent: Jul. 13, 2010

(54) METHOD OF FORMING DISLOCATION-FREE STRAINED THIN FILMS

(75) Inventors: Ya-Hong Xie, Beverly Hills, CA (US); Jeehwan Kim, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 991 days.

(21) Appl. No.: 11/458,628

(22) Filed: Jul. 19, 2006

(65) Prior Publication Data

US 2007/0017438 A1 Jan. 25, 2007

Related U.S. Application Data

(60) Provisional application No. 60/700,449, filed on Jul. 19, 2005.

(51) Int. Cl.
*H01L 21/324* (2006.01)
(52) U.S. Cl. .................. 117/2; 117/4; 117/7; 438/455; 438/458; 438/459
(58) Field of Classification Search .......... 117/2, 117/4, 7; 438/455, 458, 459
See application file for complete search history.

(56) References Cited

U.S. PATENT DOCUMENTS

| 5,374,564 | A | 12/1994 | Bruel |
| 5,993,677 | A | 11/1999 | Biasse et al. |
| 6,991,998 | B2 | 1/2006 | Bedell et al. |
| 2004/0192067 | A1 | 9/2004 | Ghyselen et al. |
| 2004/0195656 | A1 | 10/2004 | Ghyselen et al. |
| 2006/0001089 | A1* | 1/2006 | Bedell et al. ........ 257/347 |
| 2006/0063358 | A1* | 3/2006 | Bedell et al. ........ 438/483 |
| 2006/0105106 | A1 | 5/2006 | Balseanu et al. |

OTHER PUBLICATIONS

Yin et al., Ultrathin Strained-SOI by Stress Balance on Compliant Substrates and FET Performance, IEEE Trans. On Elec. Devices, vol. 52, No. 10, Oct. 2005.
Huang et al., Relaxation of a Strained Elastic Film on a Viscous Layer, Mat. Res. Soc. Symp. Proc. vol. 695 2002.
Liang et al., Relaxation of Compressed Elastic Islands on a Viscous Layer, ACTA Materialia 50, 2933-2944 (2002).
Hobart et al., Fabrication of SOI Substrates With Ultra-Thin Si Layers, Electronics Letters, vol. 34, No. 12 pp. 1265-1266 (1998).
Esser, Improved Low-Temperature Si-Si Hydrophilic Wafer Bonding, Journal of Electrochemical Society, 150 (30 G228-G231) (2003).
B. Ghyselen et al., Engineering Strained Silicon on Insulator Wafers with the Smart Cut Technology, Solid-State Electronics 48, pp. 1285-1296 (2004).

* cited by examiner

*Primary Examiner*—Robert M Kunemund
*Assistant Examiner*—Matthew J Song
(74) *Attorney, Agent, or Firm*—Vista IP Law Group LLP

(57) ABSTRACT

A method of forming a stressed thin film on a substrate includes forming a plurality of islands on a viscous layer that is present on a surface of a substrate. Adjacent islands are bridged with a stressor layer. The structure is annealed at an elevated temperature above the glass flow temperature of the viscous layer to transfer at least a portion of the stress from the stressor layer to the underlying islands. The bridges are then removed to expose the stressed islands of thin film on the substrate.

14 Claims, 5 Drawing Sheets

METHOD OF FORMING DISLOCATION-FREE STRAINED THIN FILMS

REFERENCE TO RELATED APPLICATIONS

This Application claims priority to U.S. Provisional Patent Application No. 60/700,449 filed on Jul. 19, 2005. U.S. Provisional Patent Application No. 60/700,449 is incorporated by reference as if set forth fully herein.

STATEMENT REGARDING FEDERALLY SPONSORED RESEARCH AND DEVELOPMENT

This invention was made with Government support under Grant No. FA9550-04-1-0370, awarded by the Air Force Office of Scientific Research. The Government has certain rights in this invention.

FIELD OF THE INVENTION

The field of the invention generally relates to methods for forming stressed (e.g., compressive of tensile) thin films. More particularly, the field of the invention relates to methods used to form dislocation-free stressed thin films.

BACKGROUND OF THE INVENTION

The use of strained silicon devices is known to increase semiconductor device performance. For example, in the context of transistors, strained silicon increases the transistor drive current which improves switching speed by making current flow more smoothly. Generally, a very thin layer of single-crystal silicon with built in stress (or strain) improves drive current making the devices fun faster. When the layer of silicon is under stress, the silicon lattice lets electrons and holes flow with less resistance. For transistors, the lower resistance translates in to faster switching properties, thereby permitting semiconductor devices to operate at faster speeds.

Because of the advantages inherent in the strained lattice structure, strained silicon or silicon germanium based devices have become an attractive alternative to current microelectronic devices that are composed of a silicon channel layer on a silicon substrate. Several approaches have been developed to form strained silicon on substrates. For example, relaxed silicon germanium buffer layers have been employed as a "virtual substrate" to grow strained silicon. Typically, the relaxed silicon germanium buffer layer, which has a higher lattice constant than the silicon substrate, is formed in a graded manner and is used as an epitaxial growth template.

If a constant (i.e., non-graded composition) silicon germanium buffer layer is used, high densities of dislocations nucleate during growth and interact with one another. This interaction prevents dislocations from propagating to the edge of the substrate (e.g., a wafer), thereby leaving a significant number of threading arms on the surface of the silicon germanium layer. In contrast, by grading the germanium composition during growth of the relaxed silicon germanium layer on a silicon substrate, the nucleation rate of dislocations is retarded by reducing the strain accumulation rate. Consequently, the interaction between dislocations is reduced, significantly reducing the density of threading arm dislocations on the surface of the silicon germanium layer. For example, the threading dislocation density in a constant (non-graded) silicon germanium grown directly on a silicon substrate is on the order of about $10^{8\sim9}/cm^2$. If a graded silicon germanium buffer layer is formed on a silicon substrate, the threading dislocation density improves to around $10^{4\sim5}$ cm$^2$.

Unfortunately, there are several disadvantages to graded silicon germanium buffer layers. First, the threading dislocation density, while lower in graded buffer layers, is still non-zero, which leads to degradation of electron and hole mobility. Moreover, a large thickness of graded silicon germanium buffer layer is needed for achieving low threading dislocation densities. The large thickness increases the size of the devices as well as the cost of production. Second, the strain-relaxed graded silicon germanium buffer layer has a rough surface which degrades the mobility of strained silicon. In addition, the strain at the top layer of silicon is not homogeneous due to the stress fields from buried dislocations, which also adversely affects carrier transport.

Attempts have also been made to form relaxed, dislocation free buffer templates of silicon germanium on viscous glass layers. For example, Hobart et al. disclose a process of relaxing compressively strained heteroepitaxial silicon germanium films bonded to a viscous borophosphosilicate glass (BPSG) film. Hobart et al., *Compliant Substrates: A Comparative Study of the Relaxation Mechanisms of Strained Films Bonded to High and Low Viscosity Oxides*, Journal of Electronic Materials, Vol. 29, No. 7, 2000. In this method, compressed silicon germanium thin film "islands" are transferred to a viscous BPSG layer by wafer bonding. The metastable compressed silicon germanium islands start to undergo elastic relaxation at heating of near 800° C. Because of the island patterning, the small silicon germanium islands may allow faster relaxation than dislocation introduction. Unfortunately, using this method, dislocations will develop if the thickness of the silicon germanium is too large. Typically, the maximum strain in a dislocation-free film that can be produced is around 1% if the film is kept thinner than about 10 nm. On the other hand, if the film is too thin, the relaxation process may introduce wrinkles into the silicon germanium film.

SUMMARY OF THE INVENTION

In a first aspect of the invention, a method of forming a stressed thin film on a substrate includes forming a plurality of thin film islands on a viscous layer formed on a substrate. The thin film islands may be formed from silicon or a type III-V semiconductor. Adjacent thin films are bridged with a stressor layer. The structure is annealed at an elevated temperature above the glass flow temperature of the viscous layer. The bridges are then removed to expose the stressed thin film on the substrate.

In another aspect of the invention, a method of forming a stressed thin film on a substrate includes the steps of forming a plurality of islands on a viscous layer formed on substrate. A second substrate is provided having a stressor layer formed thereon. The stressor layer (on the second substrate) is then bonded to the plurality of islands. The second substrate is then removed, for example, through a SMART-CUT process. The stressor layer is then patterned to form bridges between at least a portion of the adjacent islands. The structure is then heated at an elevated temperature above the glass flow temperature of the viscous layer. The bridges are then removed so as to expose the stressed thin film islands.

In another aspect of the invention, a method of forming a stressed thin film on a substrate includes the steps of forming a plurality of islands on a viscous layer formed on a substrate, each island having a stressor layer disposed thereon. The structure is then subject to annealing temperatures above the glass flow temperature of the viscous layer. The stressor layer is removed so as to expose a plurality of stressed, thin film islands. Another stressor layer is deposited on the plurality of stressed thin film islands and the structure is then subject to annealing temperatures above the glass flow temperature of the viscous layer. The stressor layer is then removed so as to expose a plurality of stressed thin film islands. The process can be repeated with additional stressor layers to customize the level of stress in the thin film islands.

DETAILED DESCRIPTION OF THE PREFERRED EMBODIMENTS

Figure 1A:
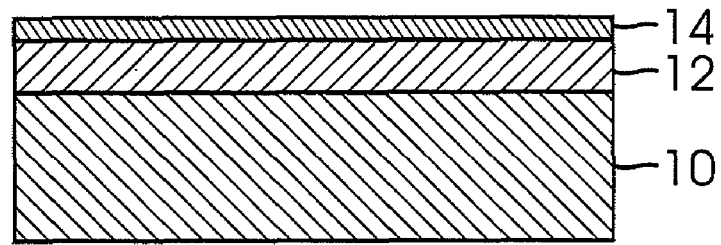
FIG. 1A illustrates a cross sectional view of a substrate having a viscous layer disposed on a top surface. A thin layer of semiconductor material such as silicon is formed on top of the viscous layer through, for example, SMART-CUT and CMP processes.

FIG. 1A illustrates a semiconductor substrate 10 having a viscous layer 12 disposed on a top surface thereof. The semiconductor substrate may be formed, for example, of silicon. The viscous layer 12 may be formed from a glass material such as, for instance, borophosphosilicate glass (BPSG). Of course, the viscous layer 12 may be formed from other materials that have similar rheological properties. For example, substances or materials that flow (or partially flow) at elevated temperatures may be used as the viscous layer 12. In certain aspects, polymer materials such as plastic-based materials may be used as the viscous layer 12.

Still referring to FIG. 1A, the top surface of the viscous layer 12 is bonded with a thin film of silicon 14. The thin film of silicon 14 formed on the viscous layer is achieved using wafer bonding and etch-back process utilizing a silicon germanium etch stop layer. The bonded wafer includes a thin silicon layer, a silicon germanium etch stop layer, and an underlying silicon host wafer. The host wafer is then subject to hydrogen ion implantation and bonded to the viscous layer 12. Using a SMART-CUT process, the silicon wafer exfoliates leaving a silicon layer overlying the silicon germanium etch stop layer. A potassium hydroxide (KOH) etch solution is used to etch the silicon until the etch stop layer. The silicon germanium etch stop layer is then removed using $CH_3COOH$:$H_2O_2$:HF solution. The process leaves the thin film of silicon 14 on the viscous layer 12. Hobart et al., *Fabrication of SOI Substrates With Ultra-Thin Si Layers*, Electronics Letters, Vol. 34, No. 12 pp. 1265-66 (1998) discloses details of such a process. The Hobart et al. publication is incorporated by reference as if set forth fully herein.

The thin film of silicon 14 may have a thickness that is generally less than 500 Å. The thickness of the thin film of silicon 14 may vary depending on the applied stress from the overlying stressor layer (discussed in more detail below). Generally, the thickness of the thin film of silicon 14 is kept less than the critical thickness at which dislocations are induced or otherwise generated at a given stress level. As an alternative to silicon, the thin film 14 may be formed from other type III-V semiconductor materials.

Figure 1B:
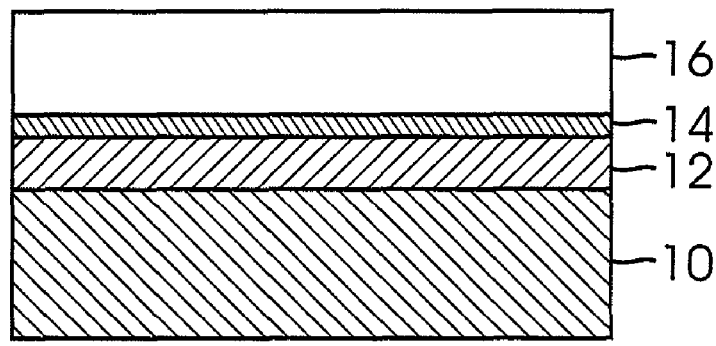
FIG. 1B illustrates the structure of FIG. 1A with an added stressor layer disposed over the thin layer of semiconductor material. The stressor layer may be under compressive or tensile stress depending on the particular embodiment of the invention.

FIG. 1B illustrates a stressor layer 16 formed over the thin film of silicon 14. The stressor layer 16 formed over the thin film of silicon 14 may be either under compressive stress or tensile stress. For example, silicon dioxide ($SiO_2$) will produce a tensile stress while silicon nitride ($Si_3N_4$) will produce a compressive stress. The degree of stress on the stressor layer 16 may be controlled by the choice of material as well as the process conditions used to form the stressor layer 16. For example, silicon nitride films deposited over the thin film of silicon 14 by plasma-enhanced chemical vapor deposition (PECVD) can produce compressive stress up to ~2 GPa, which will apply tensile stress to silicon film when relaxed. Silicon nitride films deposited by low-pressure chemical vapor deposition (LPCVD) may induce tensile stress up to 200 MPa. In contrast, silicon dioxide films formed via thermal oxidation may produce a compressive stress up to 700 MPa. Tungsten-based films (e.g., tungsten silicide) deposited by ion beam sputtering are known to exert a relatively high degree of compressive stress (up to around 5 GPa). The stressor layer 16 may also be formed from $SiO_xN_y$ (e.g., SiON).

The stressor layer 16 may be formed from materials other than those specifically mentioned above. For example, the stressor layer 16 may be formed from metals (e.g., nickel), semiconductors, and dielectric materials known to produce large degrees of stress (either compressive or tensile). Generally, stress in the stressor layer 16 may be formed as a result of the deposition process (i.e., residual strain) or via thermal stress caused by expansion of the material under elevated temperatures. Nickel, for example, has a high thermal expansion coefficient and a high melting point. Therefore, nickel produces very high stress at annealing temperatures of BPSG (~800° C.) without significant softening due to its high melting point.

The thickness of the stressor layer 16 may vary over a wide range, for example, from microns to millimeters. Unlike the prior art methods disclosed in Hobart et al., there is no size restriction on the stressor layer 16 eliminating the chance of film wrinkling. The stressor layer 16 formed on the thin film of silicon 14 forms a bilayer structure as is shown in FIG. 1B.

Figure 1C:
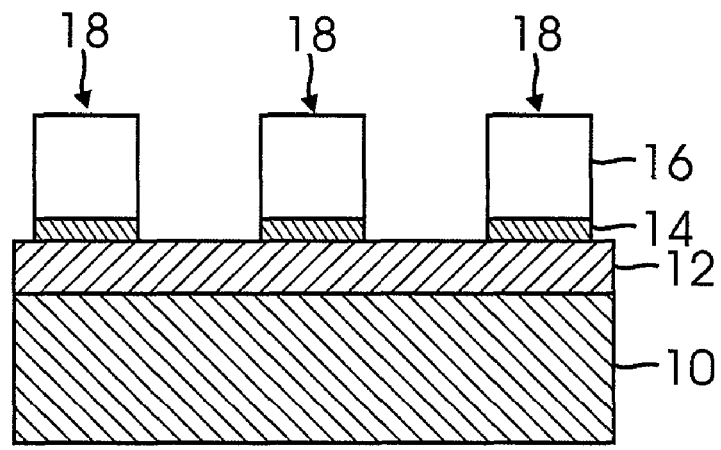
FIG. 1C illustrates the structure of FIG. 1B after a plurality of islands have been pattered over the viscous layer. The plurality of islands include a semiconductor layer and an overlaid stressor layer.

Referring now to FIG. 1C, after the stressor layer 16 is deposited, the stressor layer 16 and underlying silicon layer 14 are patterned into a plurality of islands 18. Patterning may be accomplished by processes known in the semiconductor processing arts. For example, reactive ion etching (RIE) may be used to form the plurality of islands 18. The islands 18 may be formed using conventional lithographic techniques. Generally, island shaped masks are used to selective expose areas of the stressor layer 16. The exposed areas of the stressor layer 16 can be removed by reactive ion etching (RIE) or by wet etching processes known to those skilled in the semiconductor processing arts. The underlying silicon may be removed using an etching solution of KOH. As seen in FIG. 1C, each island 18 includes a thin layer of silicon 14 and an overlying stressor layer 16. Three such islands are illustrated in FIG. 1C.

Figure 1D:
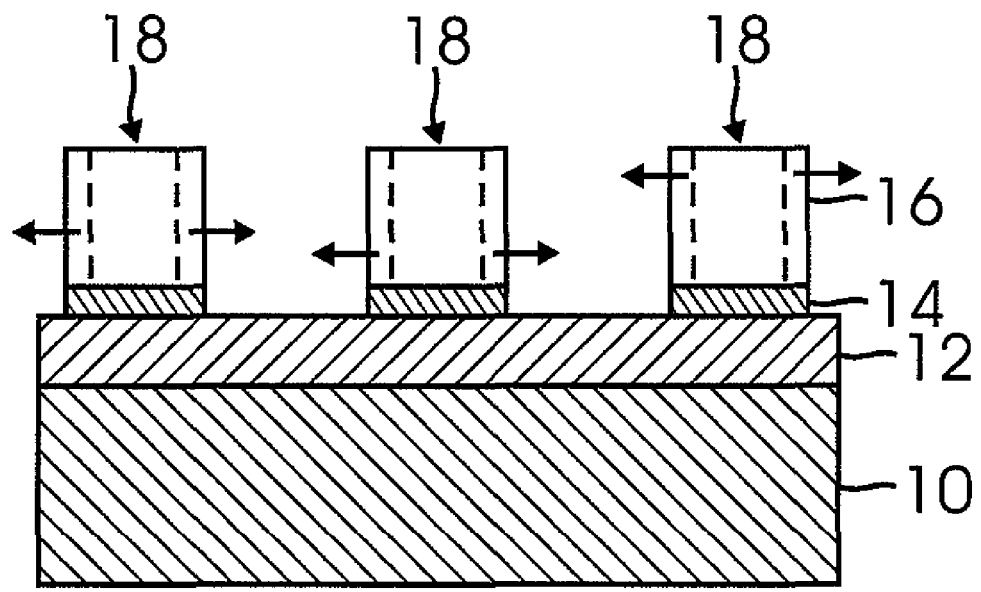
FIG. 1D illustrates the stressor layer and underlying semiconductor layer undergoing deformation. Deformation is caused by heating the structure above the glass flow temperature of the viscous layer.

Turning now to FIG. 1D, the structure shown in FIG. 1C is then heated to an elevated temperature in an annealing process such that the viscous layer 12 is heated above the glass flow temperature. If the viscous layer 12 is formed from BPSG, the structure is heated to a temperature of around 800° C. Once the viscous layer 12 is heated to a temperature above the glass flow temperature, the viscous layer 12 begins to flow. The flow of the viscous layer 12 causes stress relaxation in the stressor layer 16. For example, the stressor layer 16 undergoes stress relaxation which results in the as-deposited stress in the stressor layer 16 being distributed between the stressor layer 16 and the underlying thin film silicon layer 14. This leads to the formation of a stressed, thin film silicon layer 14.

FIG. 1D illustrates a stressor layer 16 that, as deposited, was under compressive stress. Upon flow of the underlying viscous layer 12, the stressor layer 16 undergoes relaxation by lateral expansion in the direction of the arrows in FIG. 1D. This process results in a transfer of the stress from the stressor layer 16 to the thin film silicon layer 14. In the embodiment shown in FIG. 1D, the compressive stress of the stressor layer 16 is passed, at least in part, to the thin film silicon layer 14 such that the silicon layer 14 is now under tensile stress.

Figure 1E:
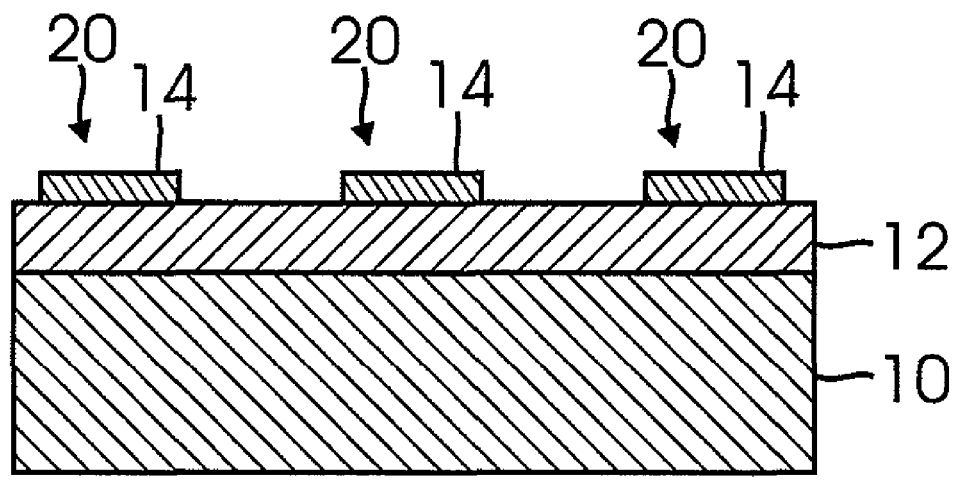
FIG. 1E illustrates the structure of FIG. 1D with the stressor layer removed leaving the underlying stressed semiconductor layer.

After relaxation, as shown in FIG. 1E, the structure of FIG. 1D is then subject to an etching process to remove the stressor layer 16. The stressor layer 16 may be removed, for example, through a wet etch process that selectively etches the stressor layer 16. Of course, other etching methods known to those skilled in the semiconductor processing arts may also be employed. For example, BOE removes silicon nitride stressor layer 16. After etching, a plurality of stressed islands 20 are formed that contain a the thin film silicon layer 14.

The method described with respect to FIGS. 1A-1E is particularly advantageous because stressed thin film silicon layers 14 (e.g. silicon islands) are substantially if not entirely free of dislocations. Moreover, the stressed thin film silicon layers 14 are wrinkle free. In prior art methods such as those disclosed by Hobart et al., the thickness of the silicon required to avoid the formation of dislocations is so thin that wrinkling inevitably occurs. In contrast, the present method may be used to form thin silicon films that are both wrinkle free and free of dislocations. Wrinkles and dislocations are avoided by choosing a thickness of silicon that is below the critical thickness and using relatively thick stressor layers. For example, given a 800° C. annealing temperature and 10 nm thickness of silicon, the present method may achieve stress levels of around 1%. The degree of stress may be increased by repeated as described below.

In one alternative aspect of the invention, the process described above is repeated a plurality of times to achieve the desired level of strain in the stressed islands 20. For example, if a single annealing and relaxation process does not transfer enough stress to the stressed islands, an additional stressor layer 16 may be deposited over the stressed islands 20. The additional stressor layers 16 may be applied using a separate substrate containing the stressor layer 16 such as that disclosed in the method illustrated in FIGS. 2A-2F. Alternatively, a photoresist or the like may be deposited in the spaces between the stressed islands 20. A second (or additional) stressor layer 16 may then be deposited over the structure. The now-formed stressor layer 16 and underlying photoresist (between the stressed islands 20) may be removed via etching.

Figure 2A:
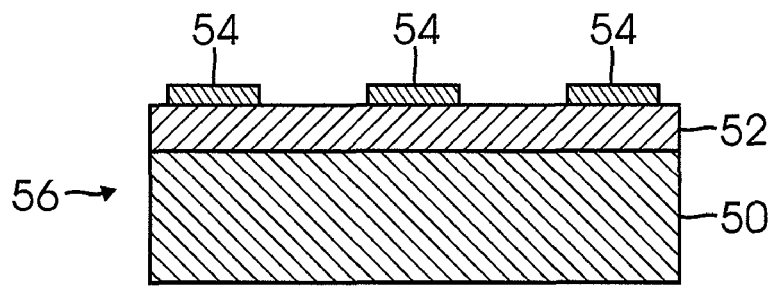
FIG. 2A illustrates a cross sectional view of a substrate having a viscous layer disposed on a top surface. A plurality of semiconductor islands are formed on top of the viscous layer.

FIGS. 2A through 2G illustrate an alternative method of forming stressed thin films on a substrate. With reference to FIG. 2A, a substrate 50 is provided having a viscous layer 52 disposed thereon. The substrate 50 may be formed from a material such as, for example, silicon as is described above. In addition, the viscous layer 52 may be formed from a glass material such as, for instance, borophosphosilicate glass (BPSG). Of course, the viscous layer 52 may be formed from other materials of the type discussed herein. A plurality of thin film semiconductor islands 54 are formed over the viscous layer 52. In one aspect of the invention, the islands 54 are formed from silicon. As an alternative to silicon, the islands 54 may be formed from other type III-V semiconductor materials. The plurality of islands 54 may be epitaxially formed over the viscous layer 52. Lithographic techniques know to those skilled in the semiconductor processing arts may be used to form the islands 54 over the viscous layer 52. The islands 54 may have a thickness that is generally less than 500 Å. The thickness of the islands 54 may, however, be greater than 500 Å. In the state shown in FIG. 2A, the islands 54 are in an un-stressed state. The substrate 50, viscous layer 52, and islands 54 may form a host wafer 56 that is used in subsequent processing steps.

Figure 2B:
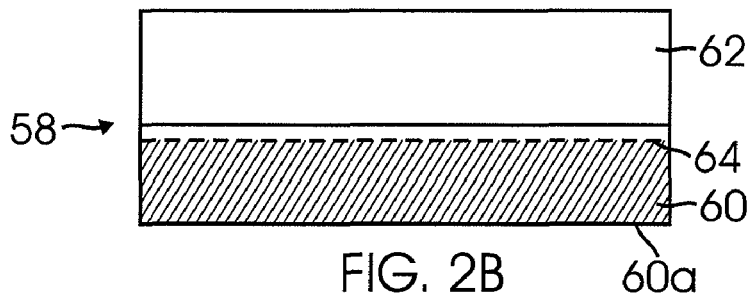
FIG. 2B illustrates a cross sectional view of a second substrate (e.g., handle wafer) having disposed thereon a stressor layer.

FIG. 2B illustrates a handle wafer 58 that is used in to transfer a stressor layer to the host wafer 56. The handle wafer 58 is formed from a transfer substrate 60 such as, for instance, silicon. A stressor layer 62 is formed over a surface of the transfer substrate 60. The stressor layer 62 may be grown over a surface of the transfer substrate 60 using one of the techniques described herein (e.g., PECVD, LPCVD, thermal oxidation, ion beam sputtering). The stressor layer 62 may be under either compressive or tensile stress on the transfer substrate 60. Alternatively, the stressor layer 62 may be in a relaxed or partially state. For example, if the stressor layer 62 is formed from a metal, the stressor layer 62 may then undergo thermal expansion in a subsequent annealing process (described in more detail below) to transfer stress to the plurality of islands 54. The stressor layer 62 may be formed from any number of materials of the type disclosed herein.

As shown in FIG. 2B, the transfer substrate 60 is then subject to hydrogen ion implantation to facilitate subsequent silicon film exfoliation (described below). The depth of penetration of the hydrogen ions on a front side 60a of the transfer substrate 60 is illustrated by the dashed line 64. Hydrogen ion implantation techniques are well known to those skilled in the art. For example, hydrogen ion implantation techniques used in connection with the so-called SMART-CUT process described in U.S. Pat. Nos. 5,374,564 and 5,993,677 and in B. Ghyselen et al., *Engineering Strained Silicon on Insulator Wafers with the SMART CUT Technology*, Solid-State Electronics 48, pp. 1285-1296 (2004) may be employed. The contents of the above-identified patents are incorporated by reference as if set fully herein.

Figure 2C:
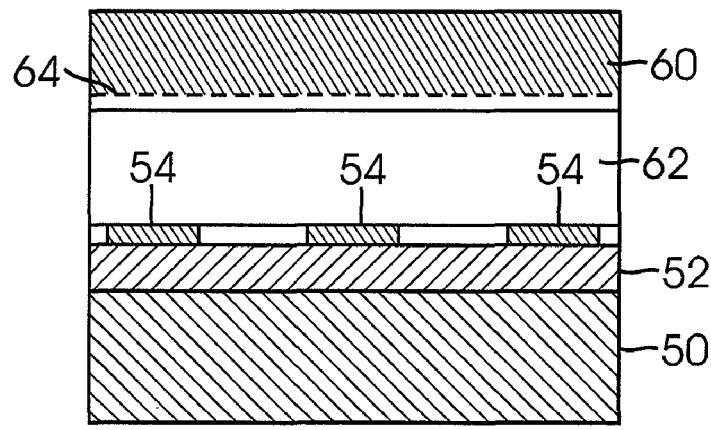
FIG. 2C illustrates the second substrate with the stressor layer being bonded to the plurality of semiconductor islands.

Next, as shown in FIG. 2C, the stressor layer 62 is then bonded directly to the plurality of islands 54. The stressor layer 62 may be bonded using a hydrophilic wafer bonding process. A hydrophilic wafer bonding process generally involves cleaning the opposing contact surfaces of the substrate 50 and stressor layer 62 and annealing the touching surfaces of the substrate 50 and stressor layer 62 at an elevated temperature. One exemplary hydrophilic wafer bonding process that may be used in accordance with the invention is a low-temperature hydrophilic wafer bonding process of the type disclosed in Esser, *Improved Low-Temperature Si—Si Hydrophilic Wafer Bonding*, Journal of Electrochemical Society, 150 (30 G228-G231) (2003), which is incorporated by reference as if set forth fully herein.

Figure 2D:
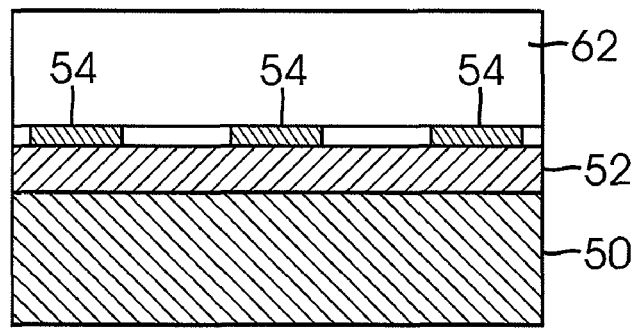
FIG. 2D illustrates the structure of FIG. 2C with the transfer substrate removed.

FIG. 2D illustrates the structure of FIG. 2C after a SMART-CUT process has cleaved the bulk of the transfer substrate 60 from the stressor layer 62. The SMART-CUT processes causes an exfoliation layer of silicon to remain on an upper surface of the stressor layer 62 (not shown). This exfoliation layer of silicon may be removed by using a KOH etchant solution.

Figure 2E:
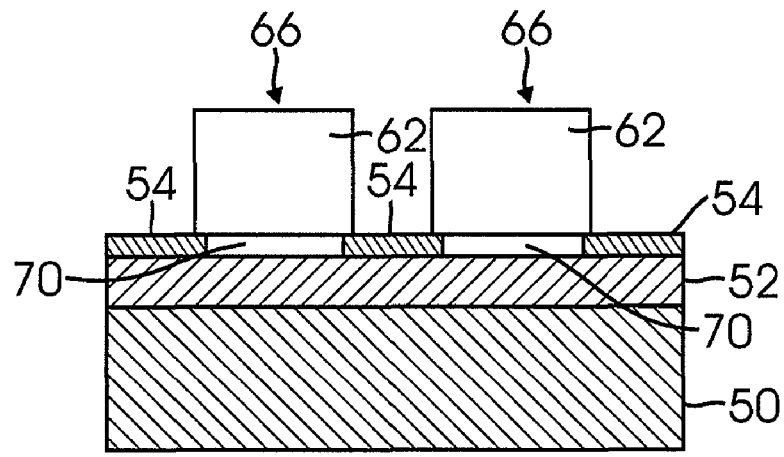
FIG. 2E illustrates the structure of FIG. 2C with the stressor layer being patterned to form a plurality of bridges interconnecting adjacent islands.
Figure 3:
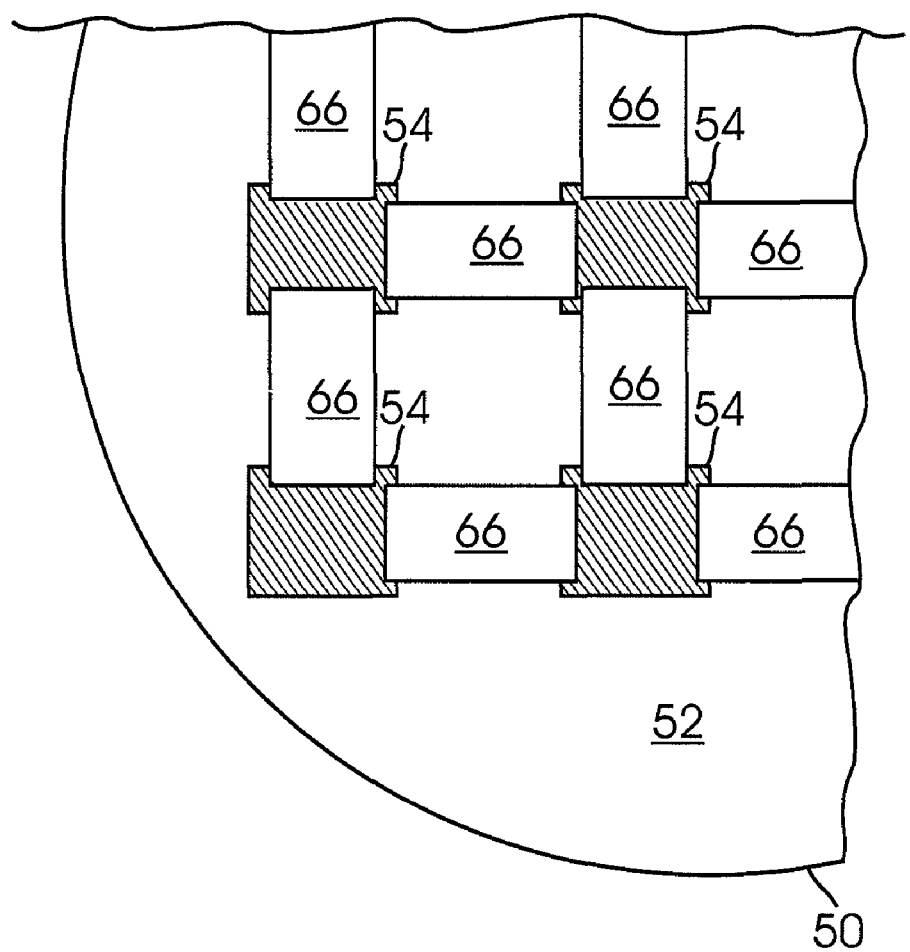
FIG. 3 illustrates a top plan view of a semiconductor substrate having a viscous layer disposed on a top surface thereof. A plurality of semiconductor islands with interconnecting bridges are formed over the viscous layer.
Figure 4:
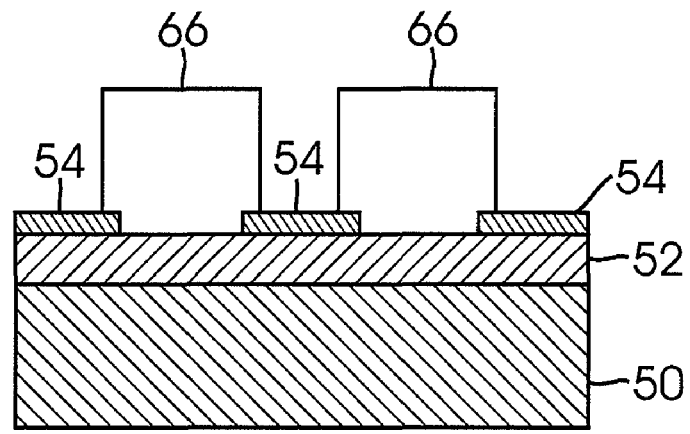
FIG. 4 illustrates a cross sectional view of FIG. 2C with the stressor layer being patterned to form a plurality of bridges interconnecting adjacent islands. In this alternative embodiment, the interconnecting bridge structures are in contact with the underlying viscous layer located between adjacent islands.

FIG. 2E illustrates the stressor layer 62 after it has been subject to a patterning operation. Portions of the stressor layer 62 may be selectively removed using conventional lithographic and etching techniques. For example, reactive ion etching may be used to selectively remove portions of the overlying stressor layer 62. Still referring to FIG. 2E, the portions of stressor layer 62 remaining after the removal process form bridges 66 that span adjacent islands 54. FIG. 3 illustrates a top plan view of a plurality of bridges 66 formed over silicon islands 54 formed on top of the viscous layer 52. As seen in FIG. 2E, a network of bridges 66 connects surrounding islands 54. As seen in FIG. 2E, the bridges 66 are suspended above the viscous layer 52, thereby forming a gap 70 in the region between adjacent islands 54. In an alternative embodiment, as shown in FIG. 4, the bridges 66 fill this gap (no longer present) and actually contact the viscous layer 52.

Figure 2F:
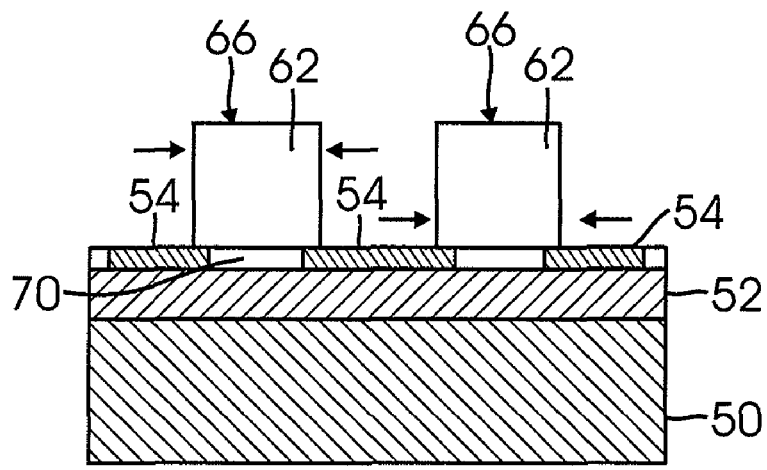
FIG. 2F illustrates the stressor layer and underlying semiconductor layer undergoing deformation. Deformation is caused by heating the structure above the glass flow temperature of the viscous layer.

Next, as shown in FIG. 2F, the structure of FIG. 2E is heated to an elevated temperature in an annealing process. The structure is heated to a temperature that exceeds the glass flow temperature of the underlying viscous layer 52. The structure is heated in a non-oxidizing environment (e.g., vacuum or inert gas environment). The length of the heating process varies depending on the size of the islands 54 but may take around one hour. In this regard, the stressor bridges 66 undergo relaxation such that at least part of the stress contained therein is transferred to the underlying silicon islands 54. In FIG. 2F, stressor bridges 66 that used to be under tensile stress before separating from the substrate undergo volumetric contraction in the direction of the arrows to reduce the level of stress. The relaxation of the stressor bridges 66 imparts tensile stress to the underlying silicon islands 54.

Figure 2G:
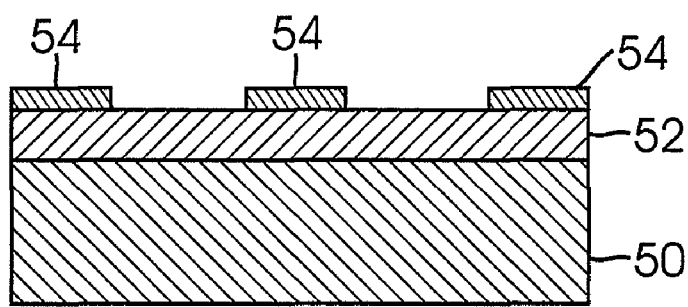
FIG. 2G illustrates the structure of FIG. 2E with the stressor layer removed leaving the underlying stressed semiconductor layer.

With reference to FIG. 2G, after the annealing process, the structure is then slowly cooled in ambient conditions. After cool down, the stressor bridges 66 are then removed from the silicon islands 54. The stressor bridges 66 may be removed by, for example, applying an etchant to selectively remove the stressor bridges 66. If the stressor bridges 66 are formed from an oxide material (e.g., silicon dioxide), a wet etchant such as a buffered oxide etchant (BOE) or hydrogen fluoride (HF) may be used. If silicon nitride is used as the stressor material, phosphoric acid may used be removed to selectively remove the stressor bridges 66.

An advantage of the method illustrated in FIGS. 2A-2G is that the degree of strain may be controllable by changing the distance between adjacent islands 54. The amount of strain transferred to silicon is a function of the length of the stressor bridges 66. Given the same island size, the larger length of stressor bridges 66 would experience longer displacements. Therefore the amount of strain transferred from the stressor bridges 66 is larger for larger lengths of stressor bridges 66. In addition, the appropriate degree of stress in the islands 54 may be chosen based on the type of stressor layer 62 that is used on the handle wafer 58. In another alternative embodiment, the degree of stress in the islands 54 may be modified by repeating the steps illustrated in FIGS. 2B-2G. Specifically, the structure formed in FIG. 2G (with stressed islands 54) may be used as the host wafer 56 illustrated in FIG. 2A. For example, if a particular stressor material could not achieve the desired amount of stress in the islands 54, the process may be repeated one or more times to increase the amount of stress transferred from the stressor layer 62 to the islands 54.

An additional advantage of the methods described herein is that the stressed islands 14, 54 are formed substantially if not entirely free of defects. In additional, since germanium is not used (in the exemplary embodiments) the problem of rampant inter-diffusion between silicon and germanium that is common in high temperature processes and self-heating from silicon germanium is avoided.

While embodiments of the present invention have been shown and described, various modifications may be made without departing from the scope of the present invention. The invention, therefore, should not be limited, except to the following claims, and their equivalents.

What is claimed is:

1. A method of forming a stressed thin film on a substrate comprising:
    forming a plurality of thin film islands on a viscous layer formed on a substrate;
    bridging adjacent thin film islands with a stressor layer, the stressor layer suspended above the viscous layer;
    annealing the viscous layer above its glass flow temperature; and
    removing the bridges.

2. The method of claim 1, wherein the stressor layer is under compressive stress.

3. The method of claim 1, wherein the stressor layer is under tensile stress.

4. The method of claim 1, wherein the viscous layer comprises borophosphosilicate glass.

5. The method of claim 1, wherein the stressor layers comprises silicon dioxide, silicon nitride, tungsten silicide, and nickel.

6. The method of claim 1, wherein the thin film islands are substantially free from dislocations.

7. The method of claim 1, wherein a single bridge connects two adjacent silicon thin film islands.

8. A method of forming a stressed thin film on a substrate comprising:
- forming a plurality of islands on a viscous layer formed on a substrate;
- providing a second substrate having a stressor layer formed thereon;
- bonding the stressor layer of the second substrate to the plurality of islands;
- removing the second substrate;
- patterning the stressor layer to form bridges between at least a portion of adjacent islands;
- annealing the viscous layer above its glass flow temperature; and
- removing the bridges so as to expose stressed thin film islands.

9. The method of claim 8, wherein the stressor layer is under compressive stress.

10. The method of claim 8, wherein the stressor layer is under tensile stress.

11. The method of claim 8, wherein the viscous layer comprises borophosphosilicate glass.

12. The method of claim 8, wherein the bridges are suspended above the viscous layer.

13. The method of claim 8, wherein the bridges are in contact with the viscous layer.

14. The method of claim 8, wherein the stressed thin film islands are substantially free from dislocations.

* * * * *